United States Patent
Hsiao

(10) Patent No.: US 9,142,410 B2
(45) Date of Patent: Sep. 22, 2015

(54) SEMICONDUCTOR NANO LAYER STRUCTURE AND MANUFACTURING METHOD THEREOF

(71) Applicant: TUNGHAI UNIVERSITY, Taichung (TW)

(72) Inventor: Hsi-Lien Hsiao, Taichung (TW)

(73) Assignee: TUNGHAI UNIVERSITY, Taichung (TW)

( * ) Notice: Subject to any disclaimer, the term of this patent is extended or adjusted under 35 U.S.C. 154(b) by 0 days.

(21) Appl. No.: 14/335,994

(22) Filed: Jul. 21, 2014

(65) Prior Publication Data
US 2015/0028285 A1 Jan. 29, 2015

(30) Foreign Application Priority Data
Jul. 26, 2013 (TW) .............................. 102126930 A

(51) Int. Cl.
H01L 21/02 (2006.01)
B82Y 40/00 (2011.01)
H01L 29/06 (2006.01)
B82Y 10/00 (2011.01)

(52) U.S. Cl.
CPC .......... *H01L 21/02603* (2013.01); *B82Y 40/00* (2013.01); *H01L 21/02628* (2013.01); *B82Y 10/00* (2013.01); *H01L 29/0673* (2013.01)

(58) Field of Classification Search
CPC .................. H01L 21/02603; H01L 21/02606; H01L 21/02628; B82Y 40/00
See application file for complete search history.

(56) References Cited

U.S. PATENT DOCUMENTS

| 7,744,793 B2 * | 6/2010 | Lemaire et al. .......... 264/172.19 |
| 2008/0018012 A1 * | 1/2008 | Lemaire et al. ................. 264/82 |
| 2008/0118634 A1 * | 5/2008 | Wei et al. ...................... 427/108 |
| 2008/0292531 A1 * | 11/2008 | Ganapathiraman et al. .......................... 423/447.2 |
| 2009/0211901 A1 * | 8/2009 | Kajiura et al. ........... 204/290.15 |
| 2010/0112373 A1 * | 5/2010 | Coffey et al. ................. 428/608 |
| 2012/0126181 A1 * | 5/2012 | Whitcomb et al. ........... 252/503 |

* cited by examiner

Primary Examiner — Allan R Wilson
(74) Attorney, Agent, or Firm — CKC & Partners Co., Ltd.

(57) ABSTRACT

A method for manufacturing a semiconductor nano layer structure includes: two substrates are provided; a plurality of semiconductor nanowires are formed on one of the substrates; an absorption surface is formed on the other substrate; one of the substrates is fixed on a cylindrical roller, the cylindrical roller is brought into contact with a surface of the substrate which is stationary and is not fixed on the cylindrical roller, and rolled with a constant velocity and pressure so that the semiconductor nanowires are break, detached, transferred and absorbed, and a semiconductor nano layer structure is formed on the stationary substrate; a de-laminating process is performed to separate the semiconductor nano layer structure from the second substrate; an electric Joule heat welding process is locally performed to bond each of the semiconductor nanowires of the semiconductor nano layer structure or each semiconductor nano layer structure.

5 Claims, 10 Drawing Sheets

SEMICONDUCTOR NANO LAYER STRUCTURE AND MANUFACTURING METHOD THEREOF

RELATED APPLICATIONS

The application claims priority to Taiwan Application Serial Number 102126930, filed on Jul. 26, 2013, which is herein incorporated by reference,

BACKGROUND

1. Technical Field

The present disclosure relates to a . nano layer structure and manufacturing method thereof, and especially relates to a semiconductor nano layer structure and manufacturing method thereof.

2. Description of Related Art

There exist urgent needs in the applications of high efficiency, low cost, large area and flexible displays or optoelectronic devices to the field of energy and mobile communication industry. In this regard, it is a must to make a breakthrough in conventional high efficiency and high cost manufacturing methods for ICs and low efficiency, low cost manufacturing methods for displays with glass substrate or thin-film solar cells, so as to meet the future requirements of the energy and mobile communication industry.

Recently, one-dimensional semiconductor nanostructure has become an essential component for the next generation electronic devices; optoelectronic devices, sensors or energy transforming devices owing to its unique features on mechanics, electrical conductions, optics, thermodynamics and chemistry. Nowadays, various semiconductor nanostructures have been developed. Many research teams utilize these semiconductor nanostructures to manufacture devices with various functionalities. However, it is a big challenge on how to transfer assembly, process and integrate the one dimensional semiconductor nanostructures to form nano electronic devices in a large scale and large area, and the aforementioned processes should be controllable, uniform and repeatable.

The main issue is that it is difficult to control the alignment and stacking direction during arranging, of the semiconductor nanowires in order to form a large area layer structure. Furthermore, for forming a semiconductor nano layer structure, conventionally it requires to disperse the nanowires on a substrate, this will lead to constrain on the followed manufacturing process. Therefore, to method that can form a large area and free-standing semiconductor nano layer structure composed of the semiconductor nanowires is very important.

SUMMARY

According to one aspect of the present disclosure, a semiconductor nano layer structure is provided. The semiconductor nano layer structure includes at least one semiconductor nano membrane, wherein the semiconductor nano membrane is formed by a plurality of free standing nanowires, and each of the semiconductor nanowires is crossly interweaved with one another at a specified angle or any angles.

According to another aspect of the present disclosure, a semiconductor nano device is provided. The semiconductor nano device includes at least one doped semiconductor nano membrane and at least one electrode layer formed on the doped semiconductor nano membrane.

According to still another aspect of the present disclosure, a method for manufacturing the semiconductor nano layer structure includes: two substrates are provided; a plurality of semiconductor nanowires are formed on one of the substrates, wherein each of the semiconductor nanowires is separately or crossly arranged to form a semiconductor nanowire array; an absorption surface is formed on the other substrate; one of the substrates is fixed on a cylindrical roller, the cylindrical roller is brought into contact with a surface of the substrate which is stationary and is not fixed on the cylindrical roller, and rolled with a constant velocity and pressure so that the semiconductor nanowires are break, detached, transferred and absorbed, and a semiconductor nano layer structure is formed on the stationary substrate; a de-laminating process is performed to separate the semiconductor nano layer structure from the second substrate; and an electric Joule heat welding process is locally performed to bond each of the semiconductor nanowires of the semiconductor nano layer structure or each semiconductor nano layer structure.

According to further another aspect of the present disclosure, a method for manufacturing the semiconductor nano layer structure includes: a solution having a plurality of semiconductor nanowires is provided; a filter and a screening membrane are located in the solution; the solution is flowed and the screening membrane is activated relative to the filter to crossly arrange the semiconductor nanowires on the filter via the screening membrane; at least one semiconductor membrane is formed by crossly arranging the semiconductor nanowires on the filter; each semiconductor membrane is stacked or connected to form a semiconductor nano layer structure; a drying process is performed for removing the water solution; the semiconductor nano layer structure is lifted-off from the filter; and an local electric Joule heat welding process is performed to bond each of the semiconductor nanowires of the semiconductor nano layer structure or each semiconductor nano layer structure.

In one example, to provide the solution having a plurality of semiconductor nanowires, the steps includes: a plurality of semiconductor nanowires are formed on a substrate, wherein each of the semiconductor nanowires is separately or crossly arranged on the substrate: the substrate is rolled by a cylindrical roller with a constant velocity and pressure to break and dump the semiconductor nanowires; the substrate with fallen semiconductor nanowires is wetted by water, and then the substrate is faced down and put on an ice; a cooling down process is performed to froze the water on the substrate with fallen nanowires, so that the semiconductor nanowires are absorbed on an iced surface of the ice; the ice with semiconductor nanowires is then lifted-off from the substrate and put on a glass beaker with a solution; the ice is heated and ultrasonic-vibrated to melt and disperse the semiconductor nanowires absorbed on the iced surface, so that the solution having a plurality of semiconductor nanowires is obtained.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
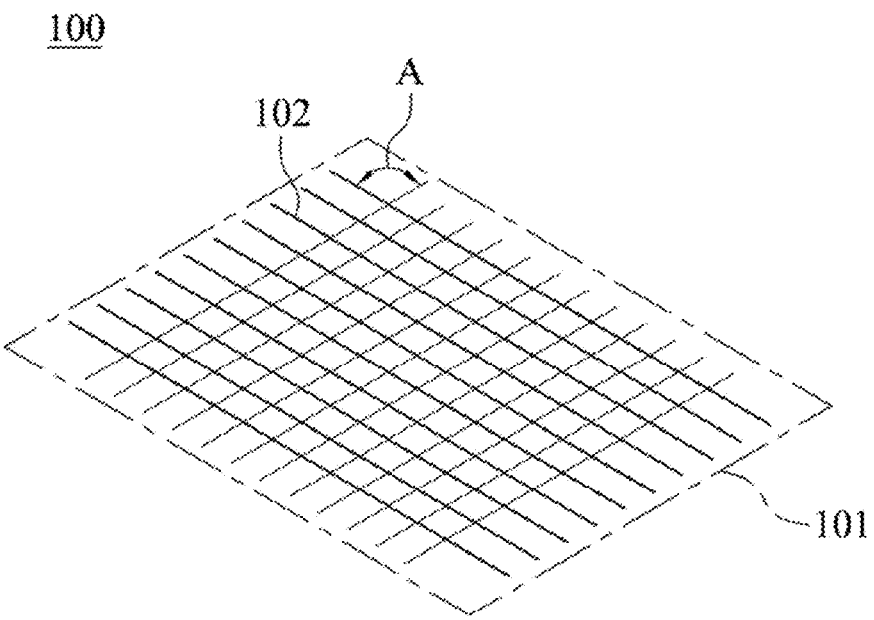
FIG. 1 is a schematic view showing a semiconductor nano layer structure according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure provides a semiconductor nano layer structure and manufacturing method thereof. The semiconductor nano layer structure can be formed by arranging or stacking semiconductor nano membranes. The semiconductor nano membrane is formed by a plurality of mutually interweaved semiconductor nanowires. A method for manufacturing the semiconductor nano layer structure is also provided. The free-standing semiconductor nano layer structure is formed by laminating a first substrate and a second substrate followed by a de-laminating process. An electrical Joule beat welding is locally performed to bond each of the semiconductor nanowires of the semiconductor nano layer structure or each semiconductor nano layer structure.

FIG. 1 is a schematic view showing a semiconductor nano layer structure 100 according to one embodiment of the present disclosure, In FIG. 1, the semiconductor nano layer structure 100 includes at least one semiconductor nano membrane 101. The semiconductor nano membrane 101 is formed by a plurality of crossly-arranged semiconductor nanowires 102. Each semiconductor nanowire 102 can be arranged regularly or irregularly, and a length of each semiconductor nanowire 102 can be from 1 to 500 µm. In FIG. 1, each semiconductor nanowire 102 are mutual-crossly and vertically arranged to form a semiconductor nano membrane 101. The semiconductor nano layer structure 100 can be formed by repeatedly connecting or stacking the semiconductor nano membrane 101. The main difference between the semiconductor nano membrane 101 of the present disclosure and conventional semiconductor nano membrane is that the semiconductor nano membrane 101 of the present disclosure is a free-standing film, without attaching to any supporting structure. Conventional nano membrane should be attached to a substrate; therefore it is not favorable for the followed processes and the applications will be constrained.

Figure 2:
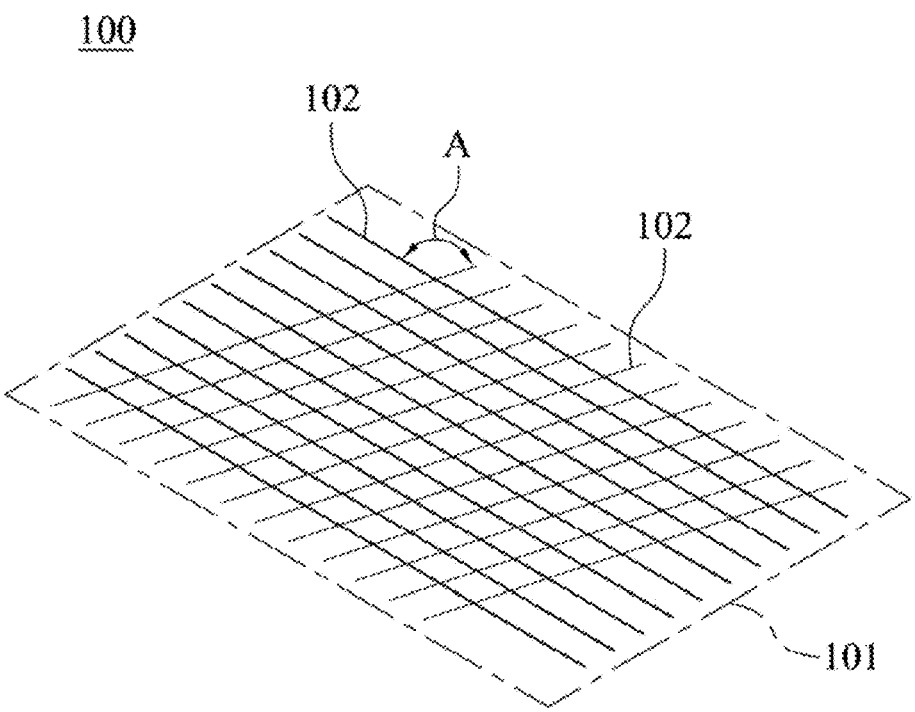
FIG. 2 is a schematic view showing a semiconductor nano layer structure according to another embodiment of the present disclosure.

FIG. 2 is a schematic view showing a semiconductor nano layer structure 100 according to another embodiment of the present disclosure. In the semiconductor nano membrane 101, each semiconductor nanowire 102 can be crossly arranged with a pre-determined angle A. In the aforementioned FIG. 1, the angle A is 90 degree, where in FIG. 2, the angle A is an obtuse angle. In another example, the angle A can be an acute angle.

Figure 3:
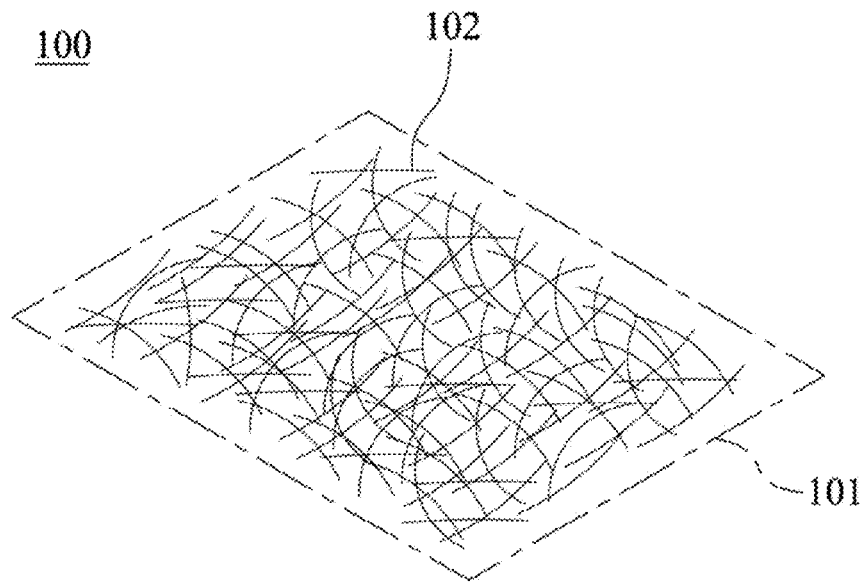
FIG. 3 is a schematic view showing a semiconductor nano layer structure according to still another embodiment the present disclosure.

FIG. 3 is a schematic view showing a semiconductor nano layer structure 100 according to still another embodiment of the present disclosure. In FIG. 3, the semiconductor nano membrane 101 is formed by interweaving of the semiconductor nanowires 102. The interweaving form is not limited; each semiconductor nanowire 102 is crossly and randomly interweaved with a specified angle or any angles. Therefore, a complicated semiconductor nano membrane 101 with high supporting strength is formed.

Figure 4A:
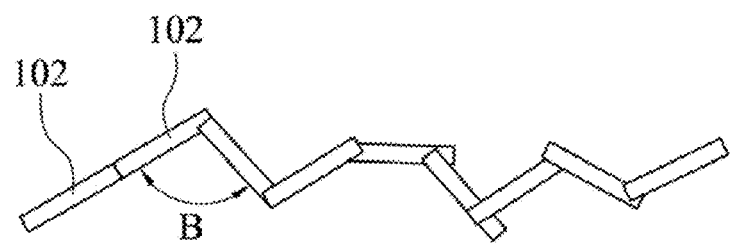
FIG. 4A is a schematic view showing a connecting method for the semiconductor nanowires.
Figure 4B:
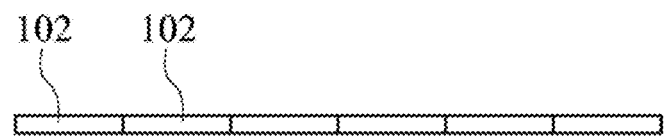
FIG. 4B is a schematic view showing another connecting method for the semiconductor nanowires.

FIG. 4A is a schematic view showing a connecting method for the semiconductor nanowires 102; and FIG. 4B is a schematic view showing another connecting method for the semiconductor nanowires 102. In FIG. 4A, each semiconductor nanowire 102 is crossly arranged and mutually connected with an angle B to form a strip. The angle B can be a right angle, an acute angle or an obtuse angle. In FIG. 4B, each semiconductor nanowire 102 is mutually connected end to end to form a strip. The aforementioned semiconductor nano membrane 101 can be formed by repeatedly connecting the semiconductor nanowires 102 according to the connecting method in FIG. 4A or FIG. 4B, or by a mixing of the connecting method in FIG. 4A and FIG. 4B. Therefore, the complicated semiconductor nano membrane 101 can be achieved, thus the semiconductor nano membrane 101 has a stronger supporting strength and structure.

Figure 5:
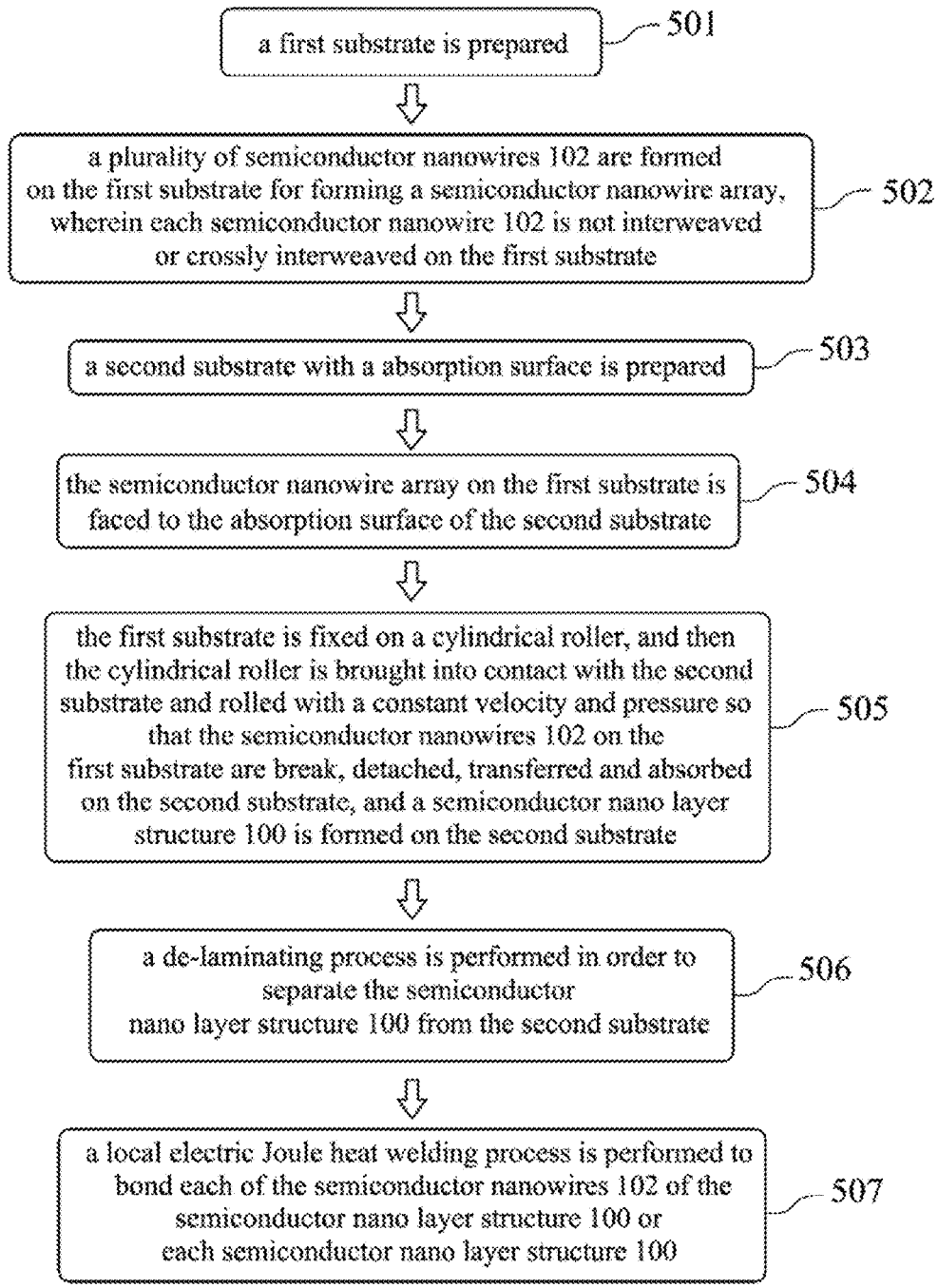
FIG. 5 is a flow chart showing a method for manufacturing the semiconductor nano layer structure according to one embodiment of the present disclosure.

FIG. 5 is a flow chart showing a method for manufacturing the semiconductor nano layer structure 100 according to further another embodiment of the present disclosure. The method includes: step 501, a first substrate is prepared; step 502, a plurality of semiconductor nanowires 102 are formed on the first substrate for forming a semiconductor nano wire array, wherein each semiconductor nanowire 102 is not interweaved or crossly interweaved on the first substrate; step 503, a second substrate with a absorption surface is prepared; step 504, the semiconductor nanowire array on the first substrate is faced to the absorption surface of the second substrate; step 505, the first substrate is fixed on a cylindrical roller, and then the cylindrical roller is brought into contact with the second substrate and rolled with a constant velocity and pressure so that the semiconductor nanowires 102 on the first substrate are break, detached, transferred and absorbed on the second substrate, and a semiconductor nano layer structure 100 is formed on the second substrate; step 506, a de-laminating process is performed in order to separate the semiconductor nano layer structure 100 from the second substrate; step 507, a local electric Joule heat welding process is performed to bond each of the semiconductor nanowires 102 of the semiconductor nano layer structure 100 or each semiconductor nano layer structure 100.

In step 502, the semiconductor nanowires 102 can be formed by metal catalytic synthesizing process, catalyst-free vapor phase growth or mask/maskless electrochemical etching of crystalline substrate.

In order to synthesize the semiconductor nanowires 102, a metallic catalyst reaction is utilized for controlling the geometry of the semiconductor nanowires 102. Therefore, it is necessary to form a metallic catalyst film on the first substrate. The metallic catalyst film is made of Zn, Al, Ga, In, Au, Ag, Cu, Pt, Fe, Co, Ni or alloys, compounds, nano particles, or multilayer structure (e.g. Au/Ga, Au/Ga/Au multilayer structure). The thickness of the metallic catalyst can be from one to several nanometers.

The metallic catalyst can be formed on the first substrate by vacuum evaporation, sputtering, electroplating, imprinting, dip coating, screen printing or ink jetting. Nano particles of the metallic catalyst can be composed first then a solution with nano particles is formed. Then the solution with nano particles is sprayed or injected to a surface of a substrate. In another example, the substrate can be immersed to the solution with nano particles, thus a nano membrane having metallic catalyst is formed on the substrate.

The semiconductor nanowires array can also be synthesized without catalyst. The one-dimensional growth behavior can be controlled through template confinement, oxidized layer confinement or self-catalytic reaction.

The semiconductor nanowire array can be formed by plasma enhanced chemical vapor deposition, hot-wire assisted chemical vapor deposition, chemical vapor deposition or vapor phase transport deposition. Through the aforementioned process, the intrinsic or doped semiconductor nanowires 102 are formed. The doping of the semiconductor nanowires 102 can be n-type or p-type.

The semiconductor nanowires array can also be formed through mask or maskless electrochemical etching of crystalline substrates.

In step 503, the absorption surface can be an electrostatic absorption layer, a polymer layer or an adhesion layer that the stickiness thereof is formed after heating or light irradiating. In a preferable embodiment, the absorption surface can be an iced surface.

In step 504, the semiconductor nanowire array on the first substrate is faced to the absorption surface of the second substrate.

In step 505, it should be mentioned that the first substrate can be fixed on the cylindrical roller, or the second substrate can be fixed on the cylindrical roller. Which one of the first substrate and the second substrate is fixed on the cylindrical roller is not limited. In this embodiment, the first substrate is fixed on the cylindrical roller, and then the cylindrical roller is brought into contact with the second substrate which is stationary and is not fixed on the cylindrical roller and rolled with a constant velocity and pressure so that the semiconductor nanowires on the first substrate are break, detached, transferred and absorbed on the second substrate, and a semiconductor nano layer structure is formed on the second substrate (referred as a stationary substrate).

In step 506, the de-laminating process can be performed by chemical etching or mechanical lift-off.

The step 507 is an important step. After preforming the step 507, each semiconductor nanowire 102, each semiconductor nano membrane 101 or each semiconductor nano layer structure 100 can be connected strongly, thus the supporting strength is stronger, and the application filed can be extended. Therefore, the local electric Joule heat welding is a key process.

The local electric Joule beat welding process is to utilize spot or sheet metal electrode to contact with a top and a bottom surface of the semiconductor nano layer structure 100. By applying proper voltage to the electrode, one or more electric loop is formed, and electric current are generated. Owing to higher contact resistance formed between each semiconductor nanowire 102, a local electric Joule heat is generated. Therefore, each semiconductor nanowire 102, each semiconductor nano membrane 101, or each semiconductor nano layer structure 100 formed by arranging or stacking of the semiconductor nano membrane 102 can be bonded. In addition to local electric Joule heat welding, other method such as direct bonding, intermediate layer bonding or adhesive bonding is also can be utilized.

The local electric Joule heat welding process has many functions such as: (a) bonding the semiconductor wires 102 distributed in the semiconductor nano membrane 101 and connecting the semiconductor nanowires 102 to form a network array; (b) combining the semiconductor nano membranes 101 with similar characteristics in order to increase the thickness or to form a crossly-arranged structure, thereby enhancing the mechanical strength or achieving a uniform two-dimensional electronic conductivity; (c) combing the semiconductor nano membranes 101 with different characteristics in order to obtain a specified functionality or to form a special junction; (d) combing the semiconductor nano membranes 101 with different functionality in order to extend the application field.

After applying the method aforementioned, a free-standing semiconductor nano layer structure 100 can be formed by connecting or stacking the semiconductor nano membranes 101, thus it is not necessary to be attached to another supporting structure.

Figure 6:
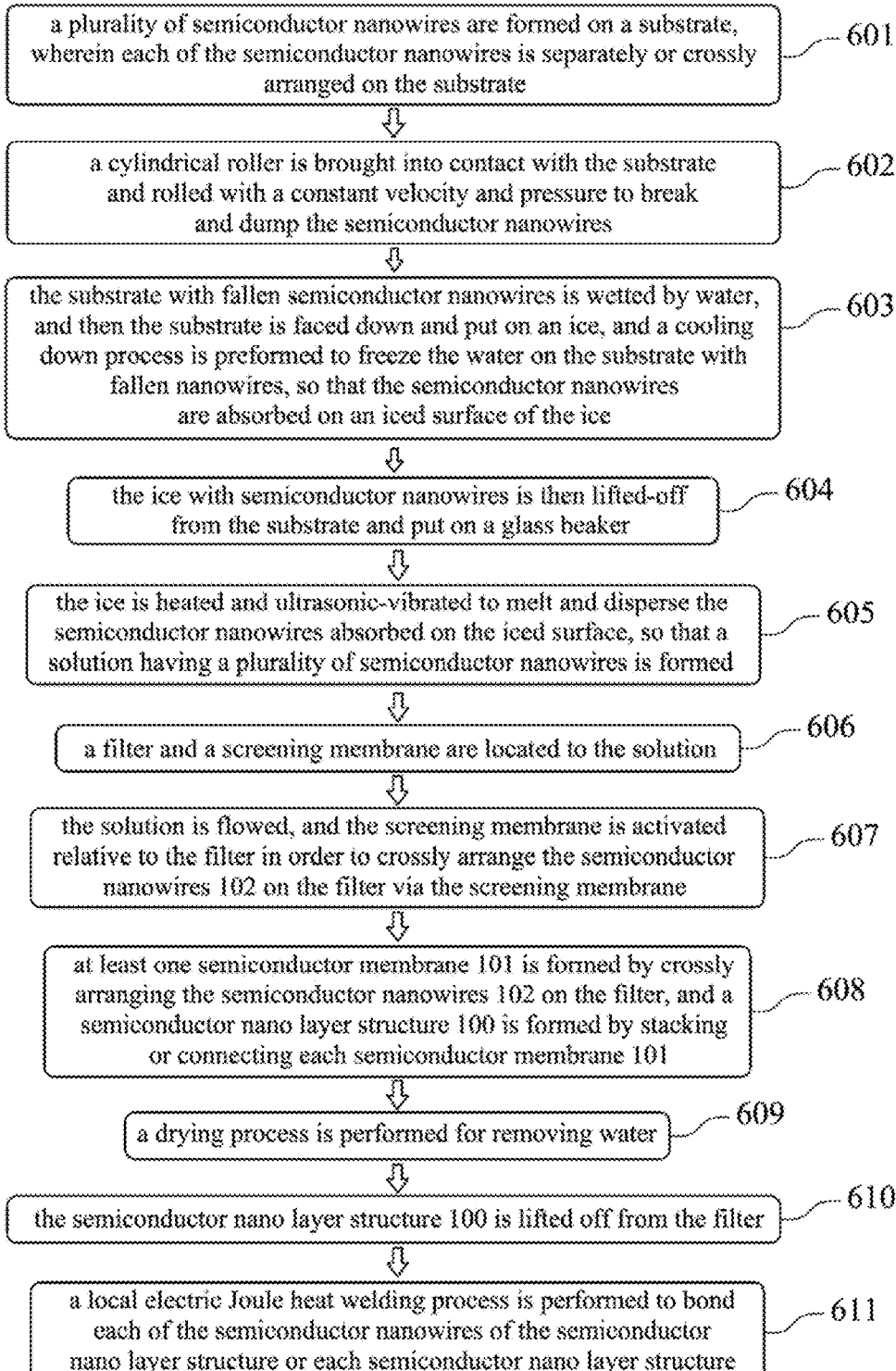
FIG. 6 is a flow chart showing another method for manufacturing the semiconductor nano layer structure according to one embodiment of the present disclosure.

FIG. 6 is a flow chart showing a method for manufacturing the semiconductor nano layer structure 100 according to further another embodiment of the present disclosure. The method includes: step 601, a plurality of semiconductor nanowires are formed on a substrate, wherein each of the semiconductor nanowires is separately or crossly arranged on the substrate; step 602, a cylindrical roller is brought into contact with the substrate and rolled with a constant velocity and pressure to break and dump the semiconductor nanowires; step 603 the substrate with fallen semiconductor nanowires is wetted by water, and then the substrate is faced down and put on an ice, and a cooling down process is preformed to froze the water on the substrate with fallen nanowires, so that the semiconductor nanowires are absorbed on an iced surface of the ice; step 604, the ice with semiconductor nanowires is then lifted-off from the substrate and put on a glass beaker; step 605, the ice is heated and ultrasonic-vibrated to melt and disperse the semiconductor nanowires absorbed on the iced surface, so that a solution having a plurality of semiconductor nanowires is obtained; step 606, a filter and a screening membrane are located in the solution; step 607, the solution is flowed, and the screening membrane is activated relative to the filter in order to crossly arrange the semiconductor nanowires 102 on the filter via the screening membrane; step 608, at least one semiconductor membrane 101 is formed by crossly arranging the semiconductor nanowires 102 on the filter, and a semiconductor nano layer structure 100 is formed by stacking or connecting each semiconductor membrane 101; step 609, a drying process is performed for removing the water solution; step 610, the semiconductor nano layer structure 100 is lifted off from the filter; step 611, a local electric Joule heat welding process is performed to bond each of the semiconductor nanowires of the semiconductor nano layer structure or each semiconductor nano layer structure.

In step 607, a pressure pull or a vacuum pull is utilized to flow the solution having semiconductor nanowires 102. A doping process is also can be performed in step 607. Through the doping process, a nano-tube, a nanowire, nano-tube, nano-particle or polymer fiber is doped to the solution.

In step 607, the semiconductor nanowires 102 are distributed on the filter and crossly arranged or stacked to form the semiconductor nano membrane 101. The filter includes a plurality of vacancies; a diameter of each vacancy is from 0.1 μm to 5 μm. The vacancy can be made of glass, metal such as stainless steel or Al, glass fiber, PTFE, plastic, rubber or paper. The screening membrane can be added in the direction of the solution flowed to the filter. The screening membrane has strip-liked vacancies. Each vacancy has a length greater than 50 μm and a width smaller than 10 μm. The screening membrane is utilized for controlling directions of the semiconductor nanowires 102 distributed on the filter in order to form regular or irregular arrangements. Therefore, the mechanical strength of the semiconductor nano membrane 101 can be enhanced. The screening membrane can be made by laser cutting or photolithography. The screening membrane can be made of glass or metal (stainless steel, Al, etc.). The screening membrane can be stationary to the filter, or can rotate or move relative to the filter.

The de-laminating process in step 610 and the local electric Joule heat welding process in step 611 are the same as which is already mentioned in the aforementioned FIG. 5, and will not be described again herein.

The methods for manufacturing the semiconductor nano layer structure 100 in FIG. 5 or FIG. 6 can be performed independently or the methods can be combined. For example, a semiconductor nano layer structure 100 can be formed first in accordance with the method in FIG. 5, and then the semiconductor nano layer structure 100 can be manufactured to the solution with a plurality of semiconductor nanowire 102 as in step 601.

FIGS. 7A to 7E are step diagrams showing a method for manufacturing the semiconductor nano layer structure 100 according to still another embodiment of the present disclosure.

Figure 7A:
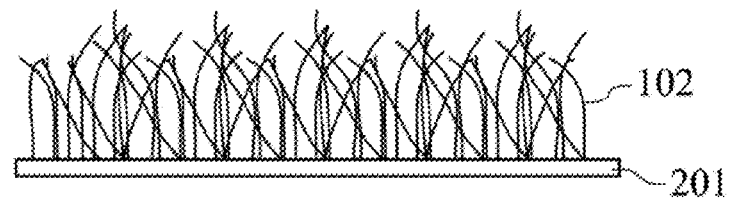
FIG. 7A to 7E are step diagrams showing a method for manufacturing the semiconductor nano layer structure according to one embodiment of the present disclosure.

In FIG. 7A, a first substrate 201 is prepared, and a plurality of semiconductor nanowires 102 is formed on the first substrate 201. The firs substrate 201 can be made of semiconductor, metal film or glass. For example, the first substrate 201 can be a silicon substrate, a stainless steel sheet, an aluminum sheet, a glass sheet or other materials.

Figure 7B:
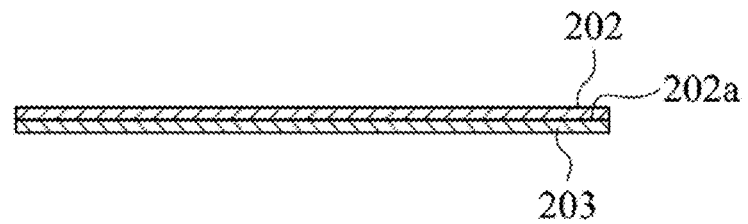

In FIG. 7B, a second substrate 201 is prepared. The second substrate is a flexible substrate with high polymer coated on one surface thereof. The second substrate 202 can be made of braided fabric, paper, plastic, glass, rubber, polymer or metal foil. One absorption surface 202a of the second substrate 202 has an adhesion layer 203. It is also possible to choose a polymer with an adhesion surface.

Figure 7C:
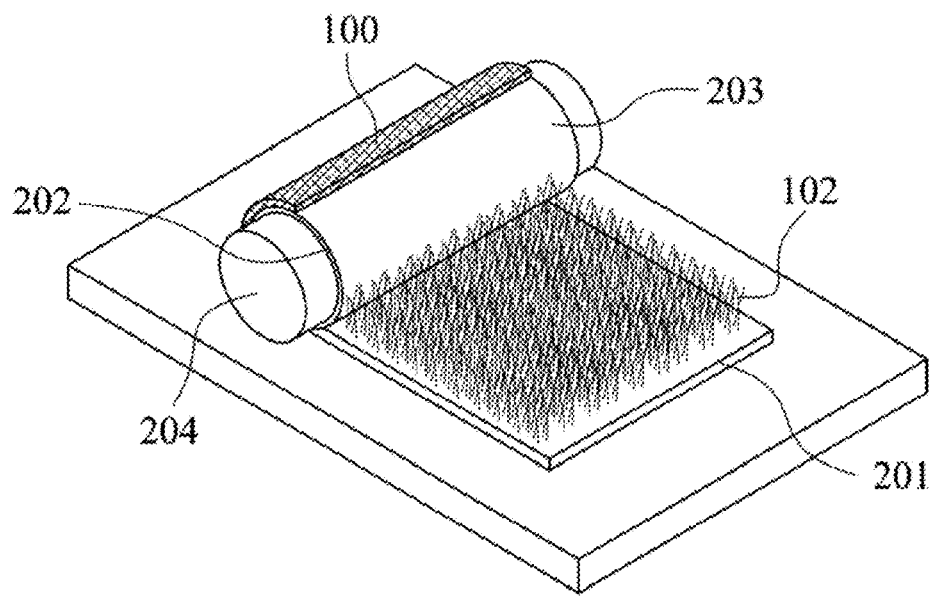
Figure 7D:
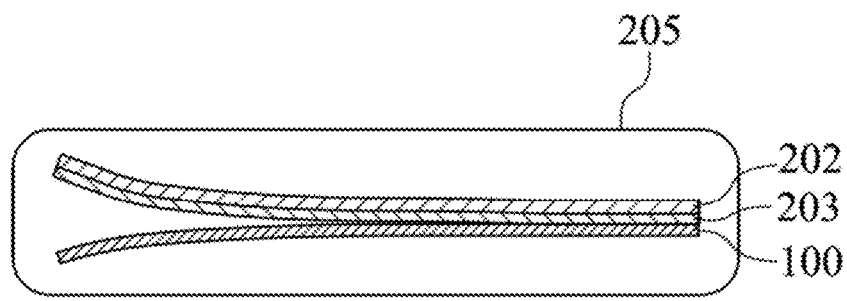

In FIG. 7C, the semiconductor nanowires 102 are faced to the absorption 202a of the second substrate 202. The first substrate 201 is fixed on the cylindrical roller 204, and then the cylindrical roller 204 is brought into contact with the second substrate 202 which is stationary and is not fixed on the cylindrical roller 204 and rolled with a constant velocity and pressure so that the semiconductor nanowires 102 on the first substrate are break, detached, transferred and absorbed on the second substrate 202, and a semiconductor nano layer structure 100 is formed on the second substrate 202. It should be known that the first substrate 201 can be fixed on the cylindrical roller 204, or the second substrate 202 can be fixed on the cylindrical roller 204, and then the cylindrical roller 204 is brought into contact with the substrate which is stationary and is not fixed on the cylindrical roller 204. In FIG. 7D a de-laminating process is performed in order to separate the semiconductor nano layer structure 100 from the second substrate 202. The de-laminating process can be performed in various methods. One method is to immerse the structure in FIG. 7C to a solution 205, thus the semiconductor nano layer structure 100 and the adhesion layer 203 can be separated. Another method is to separate the semiconductor nano layer structure 100 and the adhesion layer 203 by a mechanical lift-off process.

Figure 7E:

In FIG. 7E, a semiconductor nano layer structure 100 is formed.

Figure 8:
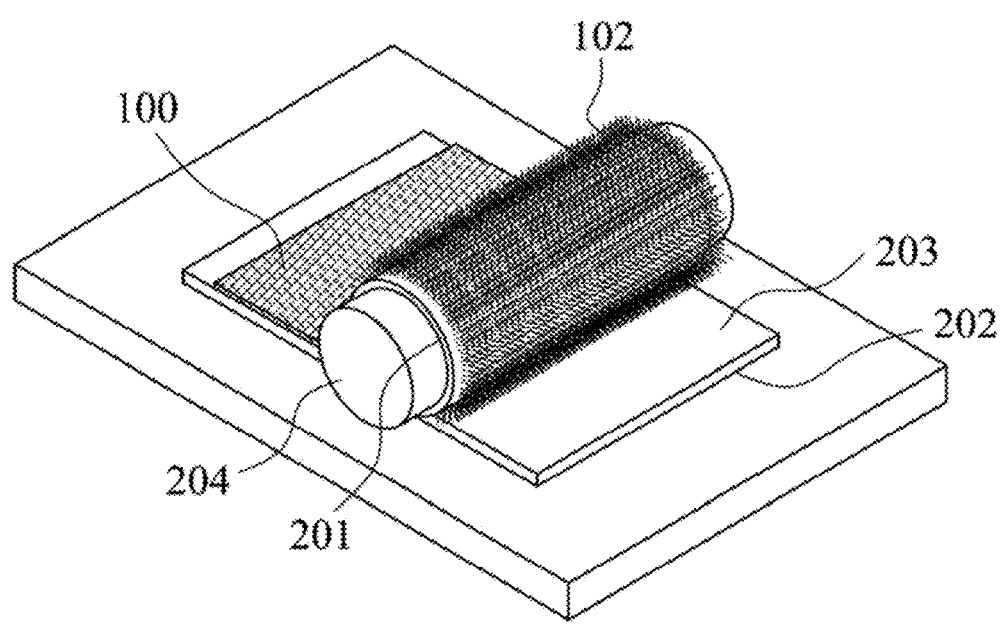
FIG. 8 is a schematic view showing another example for utilizing the cylindrical roller in FIG. 7C.

FIG. 8 is a schematic view showing another example for utilizing the cylindrical roller in FIG. 7C. In FIG. 7C, both of the first substrate 201 and the second substrate 202 can be a flexible substrate. Therefore, the first substrate 201 can be wrapped to the cylindrical roller 204 first, or, the second substrate 202 can be wrapped to the cylindrical roller 204 first.

The semiconductor nano layer structure 100 manufactured by the methods of the present disclosure not only has the same excellent semiconductor characteristics as conventional semiconductor wafers, but can overcome the bottle neck of the conventional semiconductor wafer manufacturing technology. That is, the disadvantages on the conventional semiconductor wafers such as difficult to be thinned, not flexible, broken easily, can't be grown in a large area or difficult to be grown to complete wafer for some materials, etc. can be overcome. Moreover, the semiconductor nano layer structure 100 can be a free-standing structure, thus it is favorable for the followed process performed to the semiconductor nanowires 102, such as oxidation, etching, doping, or photoresist coating. Furthermore, during the synthetic process of the semiconductor nanowires 102, a multilayer or multi-segment semiconductor nanowire 102 can be controlled synthesized, and nanowires structures with specific functionality can be formed without complicated manufacturing process.

Figure 9:
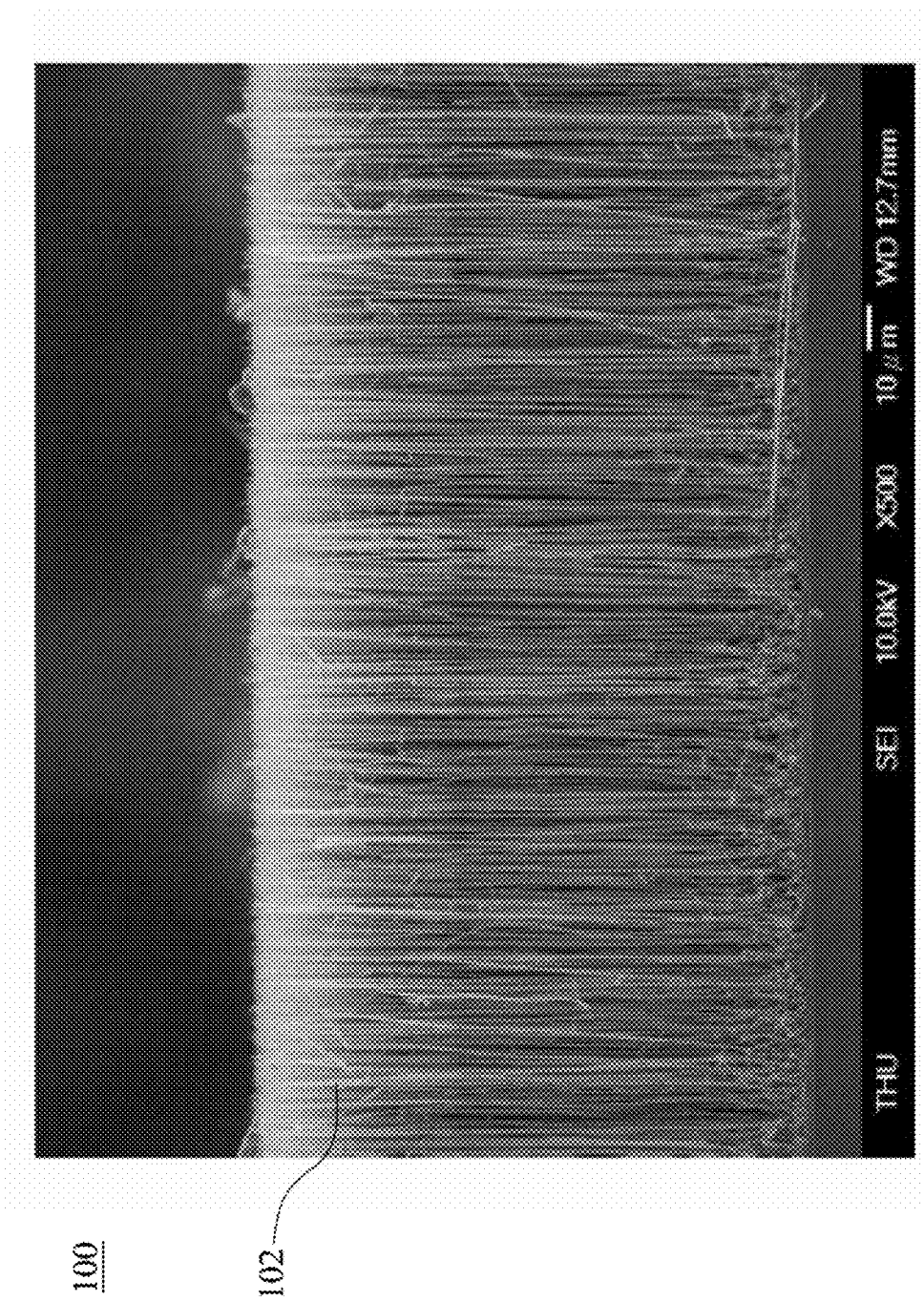
FIG. 9 is a SEM diagram showing a semiconductor nanowire array vertically aligned on a substrate.
Figure 10:
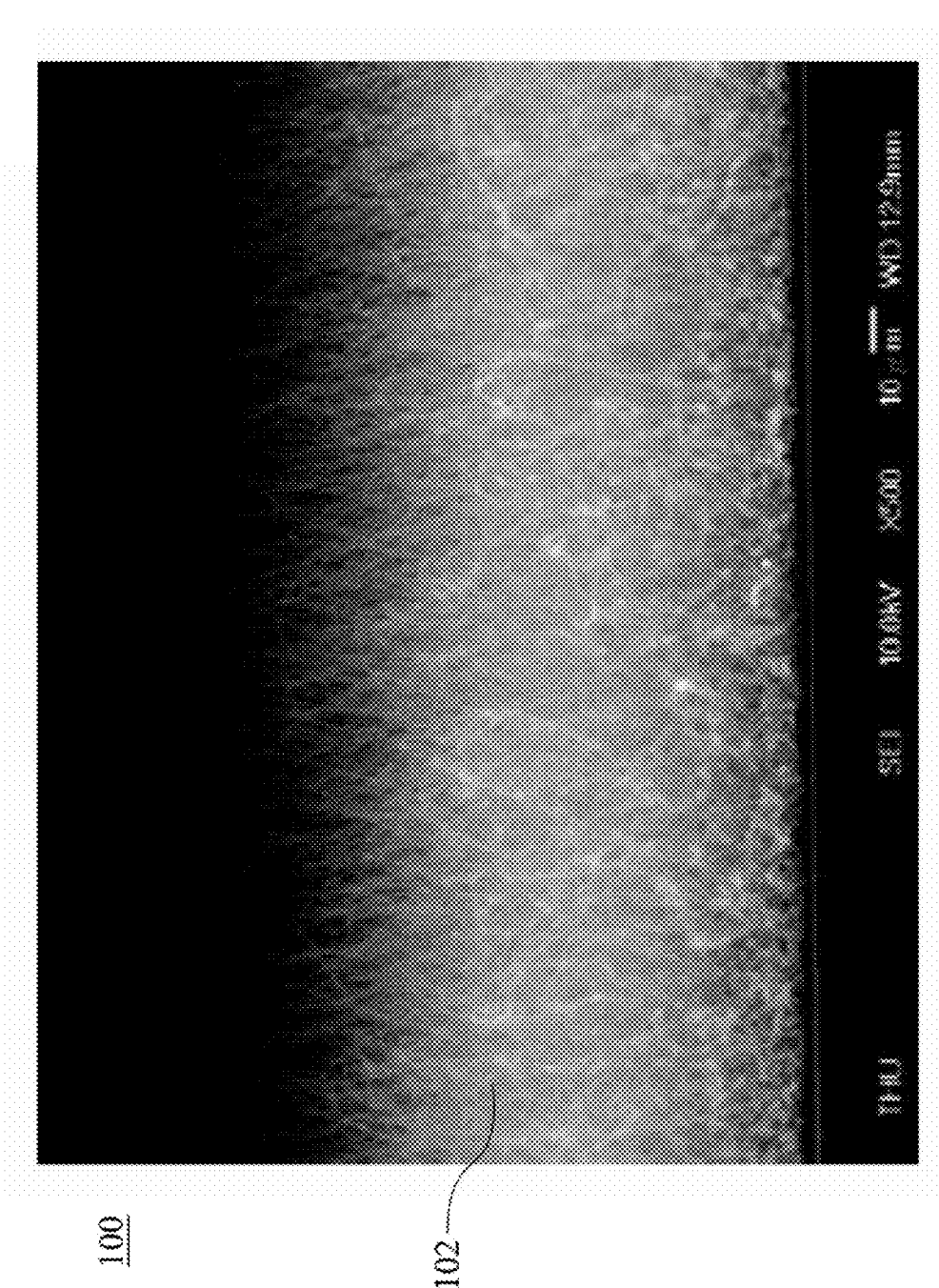
FIG. 10 is a SEM diagram showing a semiconductor nanowire array crossly interweaved on a substrate.

FIG. 9 is a SEM diagram showing a semiconductor nanowire array vertically aligned on a substrate. FIG. 10 is a SEM diagram showing a semiconductor nanowire array crossly interweaved on a substrate. in FIG. 9 or FIG. 10, the semiconductor nanowires 102 are arranged to form semiconductor nanowire array on the substrate before the laminating process is performed. The semiconductor nanowires 102 can be regularly arranged (FIG. 9) or irregularly arranged (FIG. 10).

Figure 11:
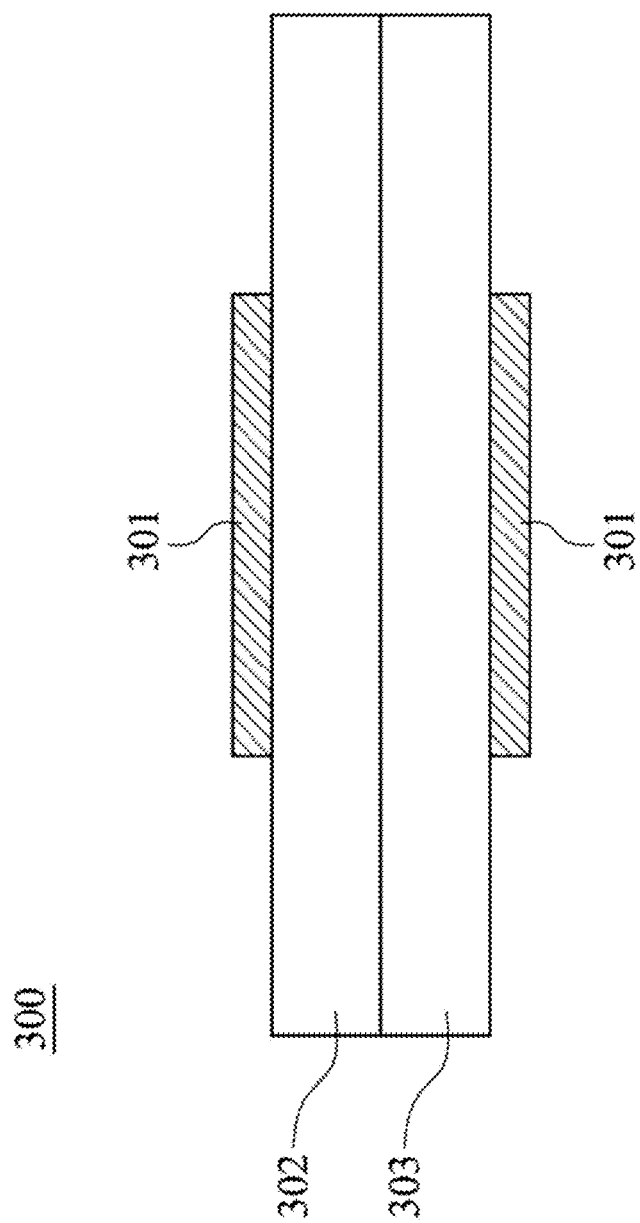
FIG. 11 is a schematic view showing a semiconductor nano device according to one embodiment of the present disclosure.

FIG. 11 is a schematic view showing a semiconductor nano device according to one embodiment of the present disclosure. The method for manufacturing the semiconductor nano layer structure 100 of the present disclosure can have various application fields, and can be utilized for manufacturing different kinds of semiconductor nano devices. It should be emphasized that the semiconductor nano layer structure 100 is free-standing and without any supporting structure (e.g. a substrate). Therefore, the structure itself can be served as a substrate, and a mismatch issue between a nano membrane or a nano paper and the substrate of the conventional nano device can be overcome. In FIG. 11, a simple light emitting diode 300 includes two electrode layers 301, a p-type doping layer 302 utilizing a semiconductor nano membrane and an n-type semiconductor doping layer 303 utilizing a semiconductor nano membrane. The light emitting diode 300 shows a main feature of the present disclosure, that is, without a substrate, the semiconductor nano layer structure itself can form a complete semiconductor nano device.

To sum up, the present disclosure provides a semiconductor nano layer structure 100 and manufacturing method thereof. The semiconductor nano layer structure 100 is free-standing and is not required supporting substrate. Therefore, the semiconductor nano layer structure 100 can extend the application field. Moreover, the material characteristics of the semiconductor nanowire 102 can be varied with different situations, and can be synthesized to form various kinds of optoelectronic devices and mechanical structures for achieving excellent performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for manufacturing a semiconductor nano layer structure, comprising:
   providing a solution having a plurality of semiconductor nanowires;
   locating a filter and a screening membrane in the solution;
   flowing, the solution and activating the screening membrane relative to the filter to crossly arrange the semiconductor nanowires on the filter via the screening membrane;
   forming at least one semiconductor membrane by crossly arranging the semiconductor nanowires on the filter, wherein each of the semiconductor nanowires is crossly interweaved with one another at a specified angle or any angles;
   stacking or connecting each semiconductor membrane to form a semiconductor nano layer structure;
   performing a drying process for removing water;
   lifting-off the semiconductor nano layer structure from the filter;
   locally performing an electric Joule heat welding process to bond each of the semiconductor nanowires of the semiconductor nano layer structure or each semiconductor nano layer structure.

2. The method of claim 1, wherein to bond each of the nanowires of the semiconductor nano layer structure or each semiconductor nano layer structure is performed by a direct bonding process, an intermediate layer bonding process or an adhesive bonding process.

3. The method of claim 1, further comprising adding a nanowire, nanotube, nanoparticle or polymer fiber to the solution.

4. The method of claim 1, wherein activating the screening membrane relative to the filter is to enable the screening membrane to be still, rotate, or move relative to the filter.

5. The method of claim 1, wherein providing a solution having a plurality of semiconductor nanowires comprising:
   forming a plurality of semiconductor nanowires on a substrate, wherein each of the semiconductor nanowires is separately or crossly arranged on the substrate to form a semiconductor nanowire array;
   rolling the substrate by a cylindrical roller with a constant velocity and pressure to break and dump the semiconductor nanowires;
   wetting the substrate with fallen semiconductor nanowires by water, and then the substrate is faced down and put on an ice;
   performing a cooling down process to freeze the water on the substrate with fallen nanowires, so that the semiconductor nanowires are absorbed on an iced surface of the ice;
   the ice with semiconductor nanowires is then lifted-off from the substrate and put on a glass beaker; and
   heating and ultrasonic-vibrating the ice to melt and disperse the semiconductor nanowires absorbed on the iced surface, so that the solution having a plurality of semiconductor nanowires is obtained.

* * * * *